(12) United States Patent
Bazzani et al.

(10) Patent No.: US 8,750,341 B2
(45) Date of Patent: Jun. 10, 2014

(54) METHOD AND APPARATUS FOR REDUCING OPTICAL SIGNAL SPECKLE

(75) Inventors: Cristiano Bazzani, Irvine, CA (US);
Daniel Draper, Portland, OR (US);
Kevin B. McDonald, Portland, OR (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 850 days.

(21) Appl. No.: 12/218,623

(22) Filed: Jul. 15, 2008

(65) Prior Publication Data

US 2009/0175302 A1 Jul. 9, 2009

Related U.S. Application Data

(60) Provisional application No. 61/019,197, filed on Jan. 4, 2008.

(51) Int. Cl.
*H01S 3/00* (2006.01)

(52) U.S. Cl.
USPC ...................................... 372/38.02

(58) Field of Classification Search
USPC ............ 372/38.02, 38.08, 29.011, 29.02, 26; 315/372
See application file for complete search history.

(56) References Cited

U.S. PATENT DOCUMENTS

| | | |
|---|---|---|
| 4,534,064 A | 8/1985 | Giacometti et al. |
| 4,545,078 A | 10/1985 | Wiedeburg |
| 4,687,924 A | 8/1987 | Galvin et al. |
| 4,719,643 A | 1/1988 | Beeman |
| 4,734,914 A | 3/1988 | Yoshikawa |
| 4,747,091 A | 5/1988 | Doi |
| 4,864,649 A | 9/1989 | Tajima et al. |
| 4,947,425 A | 8/1990 | Grizmala et al. |
| 4,968,880 A | 11/1990 | Beller |
| 5,019,769 A | 5/1991 | Levinson |
| 5,039,194 A | 8/1991 | Block et al. |
| 5,047,835 A | 9/1991 | Chang |

(Continued)

FOREIGN PATENT DOCUMENTS

| | | |
|---|---|---|
| EP | 1471671 | 12/2004 |
| JP | 58140175 | 8/1983 |

(Continued)

OTHER PUBLICATIONS

Jamie Bailey "How DVD Works", http://sweb.uky.edu/~jrbai101/dvd.htm, May 1, 1999, 6 pages.

(Continued)

*Primary Examiner* — Tod T Van Roy
*Assistant Examiner* — Tuan Nguyen
(74) *Attorney, Agent, or Firm* — Weide & Miller, Ltd.

(57) ABSTRACT

An optical signal generator is configured with an associated control system and driver configured to reduce speckle. Speckle reduction occurs by pulsing the drive signal between a first current level and a second current level. These pulses force the optical signal generator to introduce oscillations into the optical signal. The coherence of the emitted light is reduced during the period of oscillations in the optical signal, which reduces speckle. In one embodiment, the pulsing of the drive signal brings the drive signal down to a level near or below threshold, which in turn intermittently turns off the optical signal output. Returning the optical signal to a desired optical output intensity introduces the speckle reducing oscillation. The pulse frequency, and duty cycle is controlled by a duty cycle control signal to modulate overall optical power and adjust amount of despeckle.

12 Claims, 11 Drawing Sheets

(56) References Cited

U.S. PATENT DOCUMENTS

| | | |
|---|---|---|
| 5,057,932 A | 10/1991 | Lang |
| 5,272,473 A | 12/1993 | Thompson et al. |
| 5,274,494 A | 12/1993 | Rafanelli et al. |
| 5,313,173 A | 5/1994 | Lampe |
| 5,313,479 A | 5/1994 | Florence |
| 5,319,482 A | 6/1994 | Tsuchiya et al. |
| 5,334,826 A | 8/1994 | Sato et al. |
| 5,383,046 A | 1/1995 | Tomofuji et al. |
| 5,383,208 A | 1/1995 | Queniat et al. |
| 5,392,273 A | 2/1995 | Masaki et al. |
| 5,394,416 A | 2/1995 | Ries |
| 5,396,059 A | 3/1995 | Yeates |
| RE34,972 E | 6/1995 | Horiguchi et al. |
| 5,448,629 A | 9/1995 | Bosch et al. |
| 5,453,814 A | 9/1995 | Aiyer |
| 5,488,627 A | 1/1996 | Hardin et al. |
| 5,510,924 A | 4/1996 | Terui et al. |
| 5,557,437 A | 9/1996 | Sakai et al. |
| 5,570,217 A | 10/1996 | Fleuren |
| 5,574,435 A | 11/1996 | Mochizuki et al. |
| 5,594,748 A | 1/1997 | Jabr |
| 5,621,518 A | 4/1997 | Beller |
| 5,636,254 A | 6/1997 | Hase et al. |
| RE35,607 E | 9/1997 | Nagamune et al. |
| 5,673,282 A | 9/1997 | Wurst |
| 5,699,402 A | 12/1997 | Bauer et al. |
| 5,812,572 A | 9/1998 | King et al. |
| 5,822,099 A | 10/1998 | Takamatsu |
| 5,844,928 A | 12/1998 | Shastri et al. |
| 5,900,959 A | 5/1999 | Noda et al. |
| 5,926,303 A | 7/1999 | Giebel et al. |
| 5,943,152 A | 8/1999 | Mizrahi et al. |
| 5,953,690 A | 9/1999 | Lemon et al. |
| 5,956,168 A | 9/1999 | Levinson et al. |
| 5,978,393 A | 11/1999 | Feldman et al. |
| 6,002,671 A | 12/1999 | Kahkoska et al. |
| 6,010,538 A | 1/2000 | Sun et al. |
| 6,014,241 A | 1/2000 | Winter et al. |
| 6,020,593 A | 2/2000 | Chow et al. |
| 6,021,947 A | 2/2000 | Swartz |
| 6,023,147 A | 2/2000 | Cargin, Jr. et al. |
| 6,028,661 A | 2/2000 | Minami et al. |
| 6,049,413 A | 4/2000 | Taylor et al. |
| 6,058,162 A | 5/2000 | Nelson et al. |
| 6,064,501 A | 5/2000 | Roberts et al. |
| 6,075,628 A | 6/2000 | Fisher et al. |
| 6,108,113 A | 8/2000 | Fee |
| 6,111,687 A | 8/2000 | Tammela |
| 6,115,113 A | 9/2000 | Flockencier |
| H1881 H | 10/2000 | Davis et al. |
| 6,160,647 A | 12/2000 | Gilliland et al. |
| 6,175,434 B1 | 1/2001 | Feng |
| 6,229,599 B1 | 5/2001 | Galtarossa |
| 6,259,293 B1 | 7/2001 | Hayase et al. |
| 6,282,017 B1 | 8/2001 | Kinoshita |
| 6,292,497 B1 | 9/2001 | Nakano |
| 6,366,373 B1 | 4/2002 | MacKinnon et al. |
| 6,392,750 B1 | 5/2002 | Field et al. |
| 6,396,856 B1 | 5/2002 | Sucha et al. |
| 6,423,963 B1 | 7/2002 | Wu |
| 6,452,719 B2 | 9/2002 | Kinoshita |
| 6,473,224 B2 | 10/2002 | Dugan et al. |
| 6,473,418 B1 | 10/2002 | Laroia et al. |
| 6,494,370 B1 | 12/2002 | Sanchez |
| 6,512,610 B1 | 1/2003 | Minami et al. |
| 6,512,617 B1 | 1/2003 | Tanji et al. |
| 6,534,997 B1 | 3/2003 | Horishita et al. |
| 6,542,228 B1 | 4/2003 | Hartog |
| 6,547,453 B1 | 4/2003 | Stummer et al. |
| 6,556,601 B2 | 4/2003 | Nagata |
| 6,570,944 B2 | 5/2003 | Best et al. |
| 6,580,328 B2 | 6/2003 | Tan et al. |
| 6,600,590 B2 | 7/2003 | Roddy et al. |
| 6,661,940 B2 | 12/2003 | Kim |
| 6,707,600 B1 | 3/2004 | Dijaili et al. |
| 6,740,864 B1 | 5/2004 | Dries |
| 6,788,743 B1 | 9/2004 | Pfeil |
| 6,801,555 B1 | 10/2004 | Dijaili et al. |
| 6,836,493 B2 | 12/2004 | Mahowald et al. |
| 6,837,625 B2 | 1/2005 | Schott et al. |
| 6,852,966 B1 | 2/2005 | Douma et al. |
| 6,868,104 B2 | 3/2005 | Stewart et al. |
| 6,888,123 B2 | 5/2005 | Douma et al. |
| 6,909,731 B2 | 6/2005 | Lu |
| 6,934,307 B2 | 8/2005 | DeCustatis et al. |
| 6,934,479 B2 | 8/2005 | Sakamoto et al. |
| 6,941,077 B2 | 9/2005 | Aronson et al. |
| 6,952,531 B2 | 10/2005 | Aronson et al. |
| 6,956,643 B2 | 10/2005 | Farr et al. |
| 6,957,021 B2 | 10/2005 | Aronson et al. |
| 6,967,320 B2 | 11/2005 | Chieng et al. |
| 7,031,574 B2 | 4/2006 | Huang et al. |
| 7,039,082 B2 | 5/2006 | Stewart et al. |
| 7,046,721 B2 | 5/2006 | Grohn |
| 7,049,759 B2 | 5/2006 | Roach |
| 7,050,720 B2 | 5/2006 | Aronson et al. |
| 7,058,310 B2 | 6/2006 | Aronson et al. |
| 7,066,746 B1 | 6/2006 | Togami et al. |
| 7,079,775 B2 | 7/2006 | Aronson et al. |
| 7,184,671 B2 | 2/2007 | Wang |
| 7,193,957 B2 | 3/2007 | Masui et al. |
| 7,215,891 B1 | 5/2007 | Chiang et al. |
| 7,227,913 B1 | 6/2007 | Hein et al. |
| 7,265,334 B2 | 9/2007 | Draper et al. |
| 7,276,682 B2 | 10/2007 | Draper et al. |
| 7,362,972 B2 | 4/2008 | Yavor et al. |
| 7,381,935 B2 | 6/2008 | Sada et al. |
| 7,504,610 B2 | 3/2009 | Draper et al. |
| 2001/0046243 A1 | 11/2001 | Schie |
| 2002/0015305 A1 | 2/2002 | Bornhorst et al. |
| 2002/0097468 A1 | 7/2002 | Mecherle et al. |
| 2002/0105982 A1 | 8/2002 | Chin et al. |
| 2002/0105983 A1* | 8/2002 | Nomura ............... 372/38.02 |
| 2002/0109879 A1 | 8/2002 | So |
| 2002/0114383 A1 | 8/2002 | Belge et al. |
| 2004/0032890 A1 | 2/2004 | Murata |
| 2004/0047635 A1 | 3/2004 | Aronson et al. |
| 2004/0136727 A1 | 7/2004 | Androni et al. |
| 2004/0202215 A1 | 10/2004 | Fairgrieve |
| 2005/0089325 A1 | 4/2005 | Shan |
| 2005/0180280 A1 | 8/2005 | Hoshino et al. |
| 2005/0215090 A1 | 9/2005 | Harwood |
| 2006/0215716 A1* | 9/2006 | Luo et al. ............... 372/38.08 |
| 2007/0077065 A1 | 4/2007 | Forsberg et al. |
| 2007/0081130 A1 | 4/2007 | May et al. |
| 2007/0086495 A1* | 4/2007 | Sprague et al. ........... 372/38.02 |
| 2007/0273969 A1 | 11/2007 | Yoshikawa et al. |

FOREIGN PATENT DOCUMENTS

| | | |
|---|---|---|
| JP | 62124576 | 6/1987 |
| JP | 62235975 | 10/1987 |
| JP | 62281485 | 12/1987 |
| JP | 2001-189520 | 7/2001 |
| JP | 2004045989 | 2/2004 |
| WO | WO 93/21706 | 10/1993 |
| WO | WO 02/063800 | 8/2002 |
| WO | WO 2004/098100 | 11/2004 |

OTHER PUBLICATIONS

Tuan "Solace" Nguyen, "CD, CD-R, CD-RW, DVD, DVD-RAM, DVD-RW, and MO, Tweak3D.Net-Your Freakin' Tweakin" Source!, hhttp://www.tweak3d.net/articles/opticals/, May 13, 2000, 7 pages.

Richard Wilkinson, "Topic: Selecting the Right DVD Mastering Technique", DVD Technology Update, http://www.optical-disc.com/dvdupdate.html. http://qqq.optical-disc.com/dvdupdate.html. 2002, 8 pages.

(56) References Cited

OTHER PUBLICATIONS

Dr. John Rilum, "Mastering Beyond DVD Density", http://www.optical-disc.com/beyonddvd.html. 2002, 7 pages.

"CD Basics: The Bumps", Howstuffworks "How CD Burners Work", http://entertainment.howstuffworks.com/cd-burner1.htm. 2004, 3 pages.

"An Introduction to DVD Recordable (DVD-R) What is DVD Recordable?" http://www.dvd-copy.com/reference/dvd_recordable.html. 2004, 8 pages.

"An Introduction to DVD-RW", DVD White Paper, Pioneer New Media Technologies, Inc., Feb. 8, 2001, 8 pages.

* cited by examiner

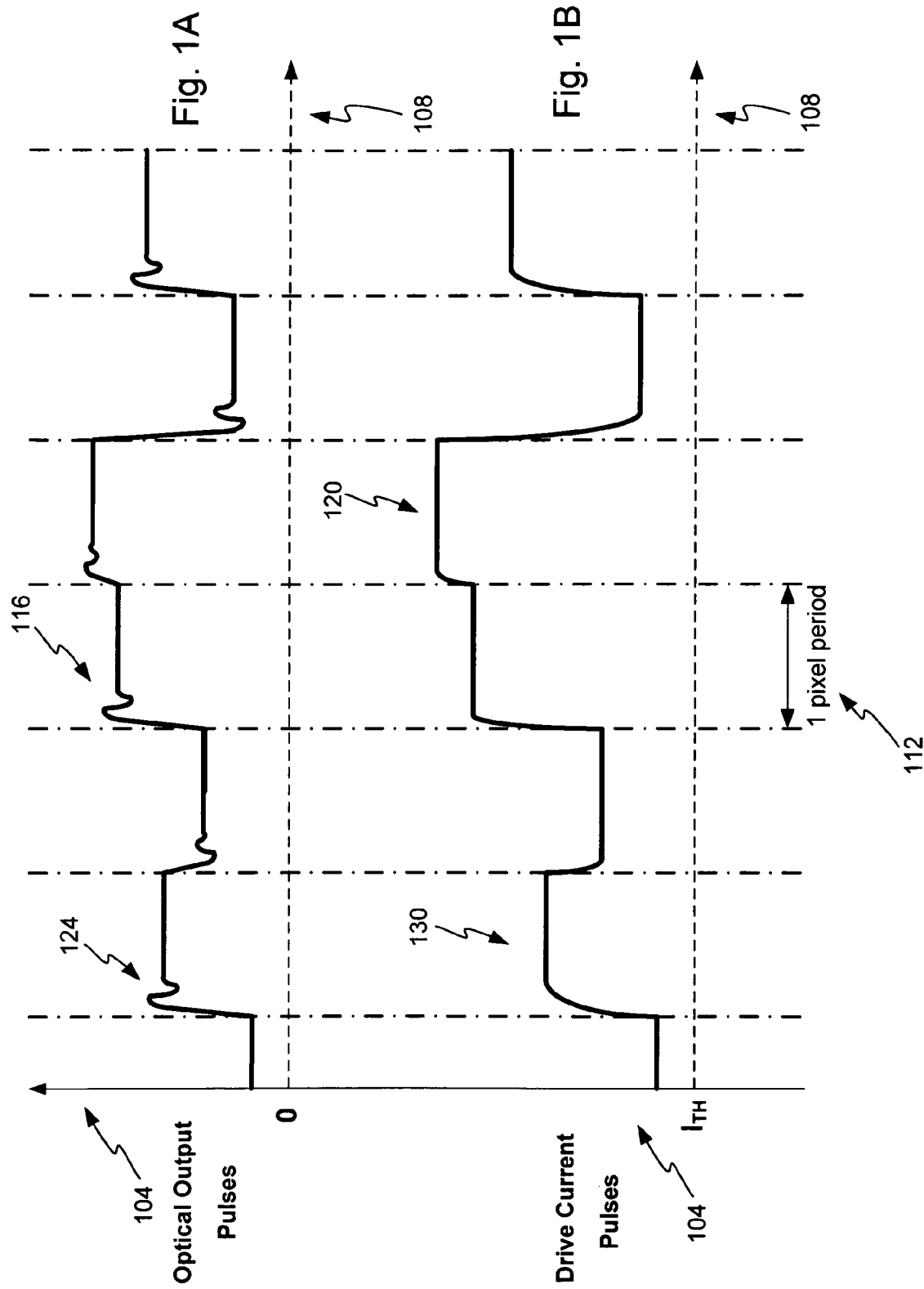

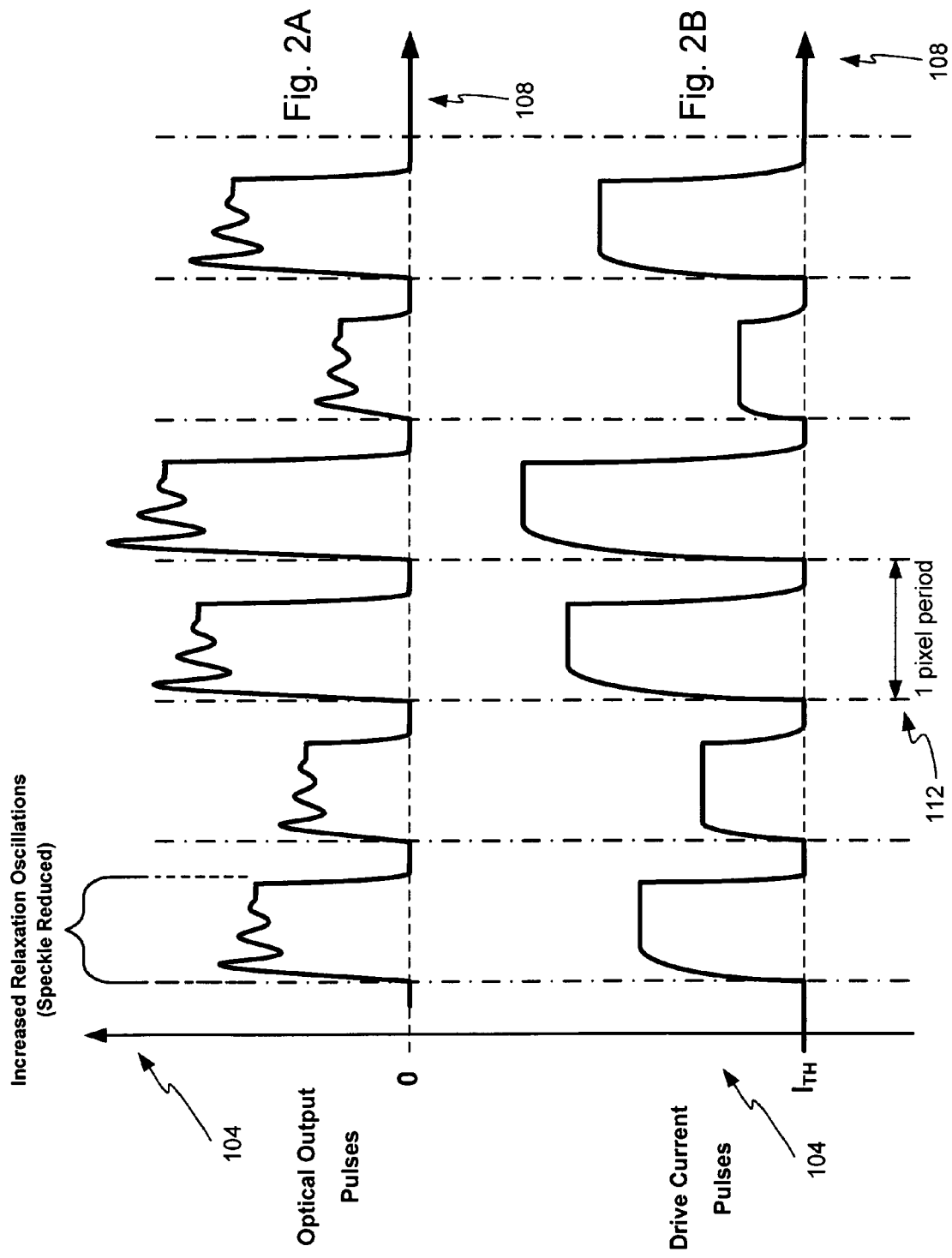

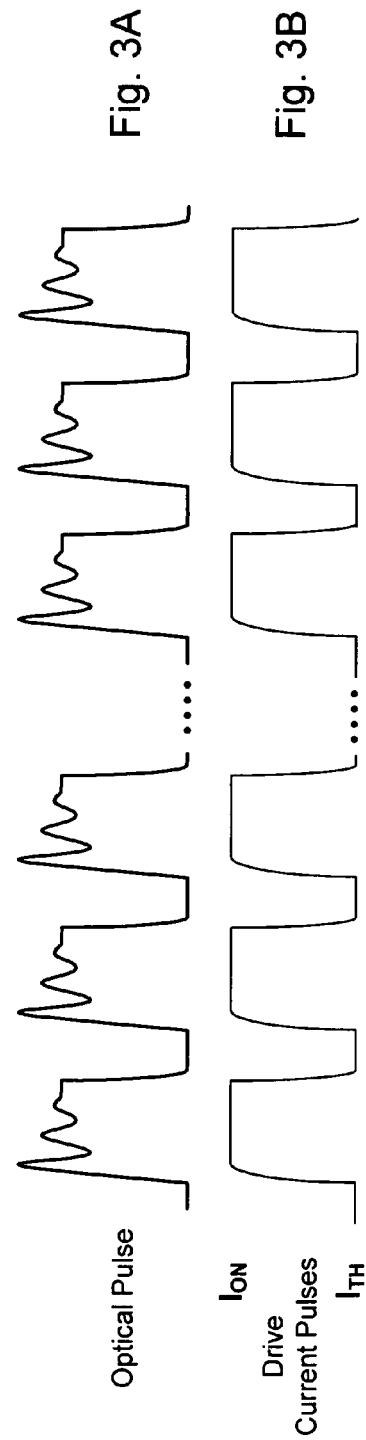
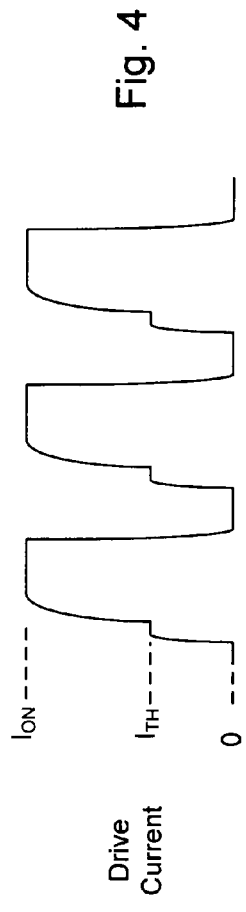
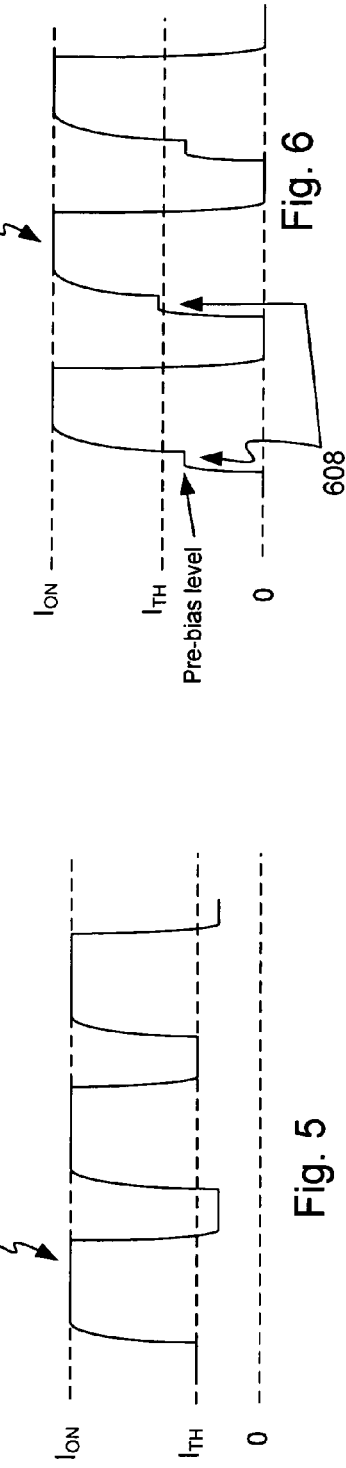

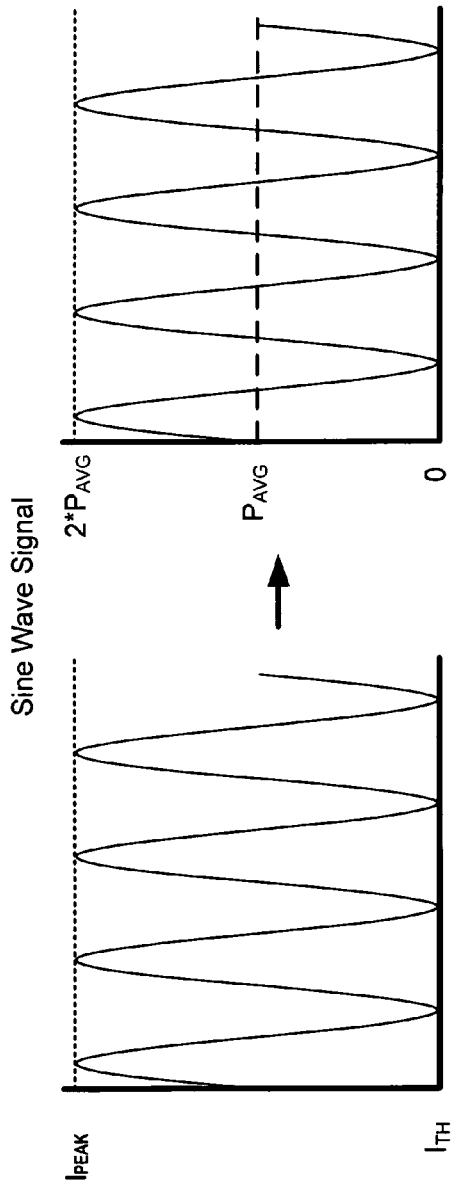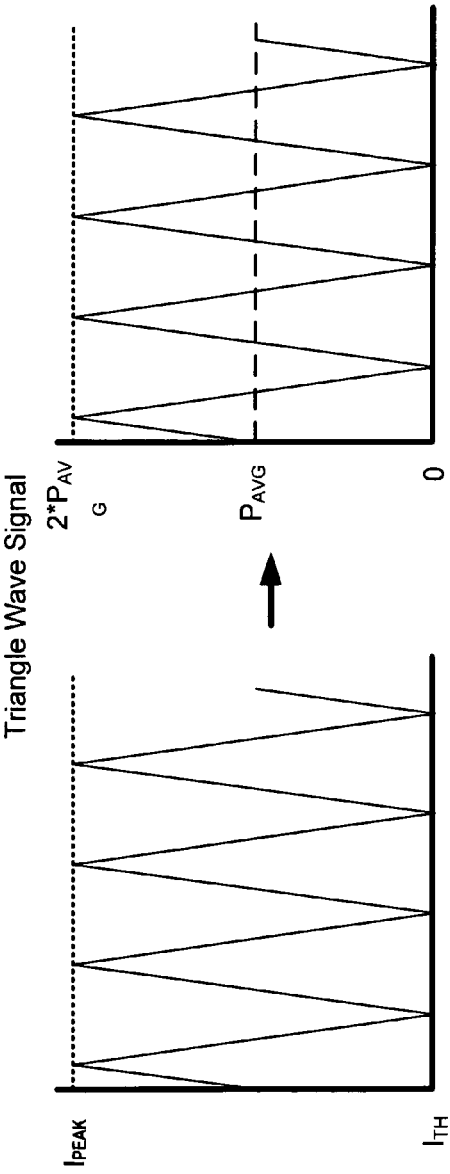

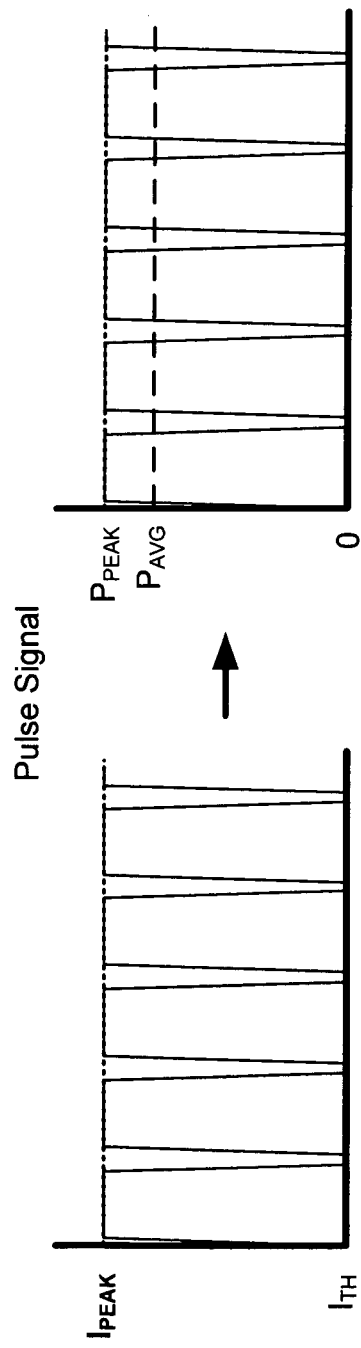

METHOD AND APPARATUS FOR REDUCING OPTICAL SIGNAL SPECKLE

PRIORITY CLAIM

This application claims benefit of and priority to U.S. Provisional Patent Application No. 61/019,197 filed on Jan. 4, 2008 entitled Method and Apparatus for Reducing Laser Speckle.

FIELD OF THE INVENTION

The invention relates to optical signal generators and in particular to a method and apparatus for reducing speckle in light output from optical signal generators.

RELATED ART

Speckle (the appearance dark areas with bright islands from light from a laser or other coherent light source) is a significant issue in many applications where a laser or combination of lasers are employed as light sources. One such application is laser projection. In a laser projection application, lasers (typically 3: red, green and blue) are used as the light source for the projected image. Various systems utilize these light sources to either "scan" through the picture by adjusting the emitted light on a pixel by pixel basis or the lasers are kept at the maximum intensity while an LCD/LCoS panel in front of them modulates the light intensity to create the desired picture. In both scenarios, speckle is clearly a concern because it degrades image quality.

Other light sources such as light emitting diodes (LEDs) do not emit as much coherent light and therefore do not exhibit excess speckle. However, LEDs are less efficient than lasers (higher power dissipation for the same amount of emitted light). Also, LEDs do not approximate a "point source" of light, so are less desirable for use in applications that need a sharply directive and collimated beam (infinite focus), such as a projection system. Therefore, it is very advantageous to use lasers in projection systems, especially small, low-power systems. Speckle is the main disadvantage of lasers in projection systems, so it is highly desirable to implement a method for reducing speckle.

Numerous other methods have been proposed for reducing or eliminating speckle, but these solutions suffer from drawbacks and do not fully overcome the drawbacks of the prior art. For example, U.S. Pat. No. 6,600,590 issued on Jul. 29, 2003 proposes numerous solutions including physically shifting mirrors to create speckle cancellation or injecting a radio frequency into a laser light source to create different speckle patters that blend together. While these methods may slightly reduce speckle, these methods fall short of feasible solutions. One such drawback is that these prior art solutions are minimally effective. Another drawback is increase complexity, cost, size, and power consumption.

SUMMARY

To overcome the drawbacks of the prior art and provide additional benefits, a speckle reduction method and apparatus is disclosed. One exemplary method for reducing speckle in light output from an optical signal generator comprises generating a drive signal wherein the drive signal periodically ranges between a first magnitude and a second magnitude to create a modulated drive signal. In this example embodiment the first magnitude is greater than the threshold current for the optical signal generator and the second current is at or less than the threshold current for the optical signal generator. For this embodiment, the threshold current may be defined as the current at which stimulated emission power exceeds spontaneous emission power. This method then presents the drive signal to an optical signal generator using the drive signal to generate an optical signal, wherein modulating the drive signal reduces speckle in the optical signal.

In one embodiment, the optical signal generator comprises a laser. It is contemplated that the drive signal periodically pulses down to the second magnitude to generate a corresponding optical signal which is below optical threshold. In one configuration, the method may further comprise generating a duty cycle control signal, wherein the duty cycle control signal controls the duration that the drive signal is at the second magnitude. The step of generating the drive signal comprises switching the drive signal between a first current level and a second current level. Regarding frequency, it is contemplated that in one embodiment periodically comprises at a rate greater than or equal to 20 MHz.

Also disclosed herein is a method for reducing speckle in an optical signal which comprises generating a drive signal and providing the drive signal to an optical signal generator. Then, responsive to the drive signal, the optical signal generator generates an optical signal such that the optical signal periodically comprise greater than 10% spontaneous emission.

It is contemplated that the optical signal generator may comprise a laser. In addition, the term periodically may comprise at a rate greater than 1 megahertz. In one embodiment, during periods when the optical signal is not greater than 10% spontaneous emission, the remainder of the optical signal is comprised of stimulated emission. Furthermore, generating a drive signal may comprise generating a drive signal that has a magnitude that periodically drops near, below or at threshold current.

Also disclosed is a method for reducing speckle in an optical signal by generating a drive signal and providing the drive signal to an optical signal generator. Then, responsive to the drive signal, generating an optical signal. In this embodiment, the optical signal generator periodically outputs light which has reduced coherence which in turn reduces speckle.

In one embodiment, the drive signal comprises pulses which pulse the optic signal generator to below threshold to create reduced coherence light. It is contemplated that the light may consist of light selected from far-infrared, infrared, visible, and ultraviolet light. In one embodiment, the method further comprises establishing a drive signal control signal such that the drive signal control signal controls the frequency and duration of the output of light which is coherent by the optical signal generator. The drive signal may comprise a first current level and a second current level, and the second current level may be near, at, or below threshold.

A system for reducing speckle in an optical signal generator is also disclosed. One configuration comprises a controller configured to generate a control signal and a switch, responsive to the control signal. The switch is configured to generate a switch output such that the switch output comprises a signal having at least a value level and a second value. This embodiment also comprises an optical signal generator configured to receive the switch output and generate an optical signal having an intensity corresponding to the switch output and the second value is at, near, or below threshold for the optical signal generator.

In one embodiment, the second value causes reduced coherence light output. The second level may be a zero signal level. It is contemplated that the control signal may comprise a duty cycle control signal and that the duty cycle control signal controls the duration of the first value and the second value. For example, the changing to the second value generates oscillation in the optical signal, which in turn reduces speckle in the optical signal.

Another system is disclosed for reducing speckle in an optical system comprising a driver configured to output a drive signal, the drive signal having a magnitude which, during operation, results in an optical power that is periodically at or below two times a threshold value. An optical signal generator is configured to receive the drive signal, and responsive to the drive signal, generate an optical signal. Due to the periodic nature of the drive signal, the optical signal has reduced levels of speckle resulting from the drive signal magnitude periodically being below threshold value.

In one variation to this system, the threshold level may be a signal input level to the optical signal generator below which light is not generated by the optical signal generator. The drive signal magnitude may alternate between a first level and a second level. In one configuration, the optical signal generator comprises multiple coherent light sources of the same or similar wavelength which are pulsed asynchronously, in a pseudo-random or random manner to below near or at threshold level to prevent image artifacts or reduce EMI. It is also contemplated the drive signal periodically dropping below near or at threshold may occur at a different times during the pixel period for each frame to prevent image artifacts or reduce EMI.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 1A illustrates a plot of optical pulses having minimal oscillations.

FIG. 1B illustrates a plot of current pulses which generate the optical pulses of FIG. 1A.

FIG. 2A illustrates the optical signal having increased oscillations.

FIG. 2B illustrates drive current pulses which create the optical signal shown in FIG. 2A.

FIG. 3A illustrates an exemplary optical signal plot resulting from the drive current pulses shown in FIG. 3B.

FIG. 3B illustrates a plot of drive current pulses.

FIG. 4 illustrates an exemplary plot of stepped driver current pulses.

FIG. 5 illustrates an exemplary plot showing driver current dropping below threshold but not reaching zero.

FIG. 6 illustrates an exemplary plot of a signal to switch the optical signal generator current off before returning to the near-threshold or "pre-bias" level.

FIG. 15A illustrates a plot of sine wave drive current over time which ranges between $I_{PEAK}$ and threshold, $I_{TH}$.

FIG. 15B illustrates a plot of optical signal power over time resulting from the drive current shown in FIG. 15A.

FIG. 16A illustrates a plot of triangle wave drive current over time which ranges between $I_{PEAK}$ and threshold, $I_{TH}$.

FIG. 16B illustrates a plot of optical signal power over time resulting from the drive current shown in FIG. 16A.

FIG. 17A illustrates a plot of pulse signal drive current over time which ranges between $I_{PEAK}$ and threshold, $I_{TH}$.

FIG. 17B illustrates a plot of optical signal power over time resulting from the drive current shown in FIG. 17A.

DETAILED DESCRIPTION

Figure 7:
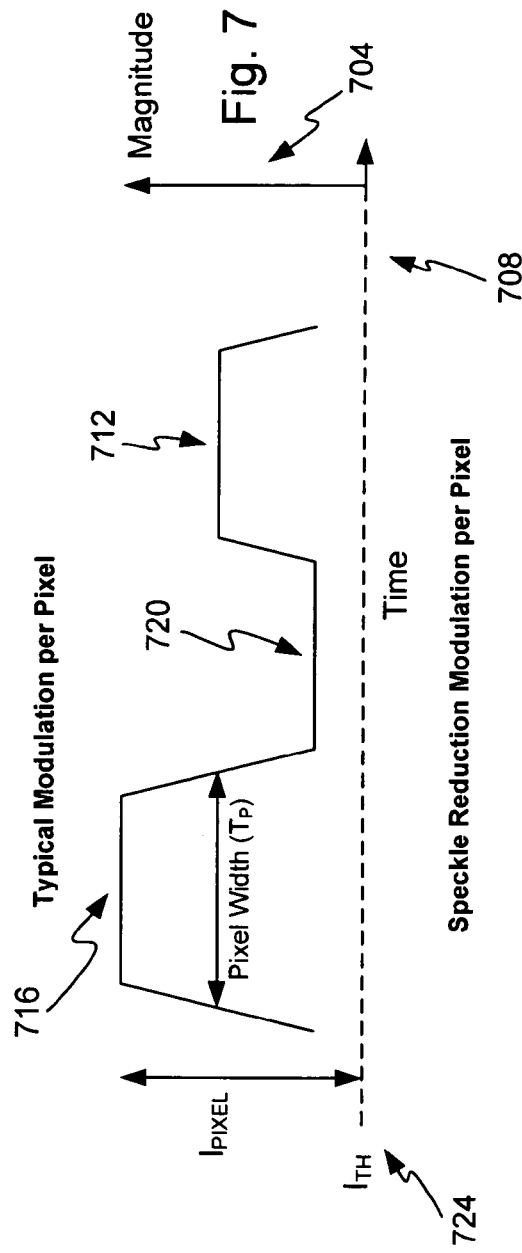
FIG. 7 illustrates an example plot of a typical optical signal generator modulation per pixel.

The term optical signal generator, as used herein is defined to mean any device, element or configuration that emits light. This may include but is not limited to laser, light emitting diode, liquid crystal display, laser diode, gas laser, color center laser, solid state laser, or any other light source that suffers from speckle or other image quality degradation due to light coherence. The term light as used herein may comprise any type or wavelength of light including but not limited to near infrared, far-infrared, visible spectrum, or ultraviolet. The term coherence refers to the broadness of the emission spectrum of the light energy considered. The broadness is typically measured by the wavelength range beyond which—the emitted power drops below half of the peak power. For projector applications an emission width of 1 nm or below is considered "coherent". Different application might consider different value of spectral broadness as coherent. It is further contemplated that other types of output energy may likewise benefit from reduced coherence. The term reduced coherence is defined as when the broadness of the emission spectrum is increased by the lesser of 50 percent or 1 nm when the laser output is composed of greater than 90% stimulated emission. This is as compared to a prior state of the optical signal, such as the optical signal prior to use of the despeckle method disclosed herein. The term broadness refers to the spectral width, such as could be measured using an optical spectrum analyzer device.

A speckle pattern is a random intensity pattern produced by the mutual interference of coherent wave fronts that are subject to phase differences and/or intensity fluctuations. Thus, speckle is an unwanted image anomaly that occurs due to coherence in light which generates the image. Coherence can take the form of frequency coherence, phase coherence, spatial coherence or any combination thereof. Light coherence occurs when the light waves align in a manner which creates constructive and destructive overlap between light waves. Constructive overlap results in increased light intensity while destructive overlap results in a decreased light intensity. To an observer, the resulting increased light intensity and decreased light intensity causes the image to appear to have speckles which occur through the image. As can be appreciated, this is distractive to a view, creates light of poor quality, and is not acceptable. While all light sources may suffer from speckle, lasers are particularly susceptible because of the high coherence of their emitted light. Thus, although lasers are highly efficient light source in relation to input power, excessive speckle of laser light has resulted in reduced laser usage. In other applications like for example barcode scanners, spectrometry, range finders speckle translates into reduced signal to noise ratio and degrades overall system performance: sensitivity, accuracy, and resolution.

When an optical signal generator is driven from an optical off state near or below the optical signal generator threshold current, it will exhibit relaxation oscillations for a certain period of time (typically a few nanoseconds or less). Threshold current is defined as the current necessary to initiate or sustain stimulated emission output from the light source. Threshold current is dependant on the particular light source. During the time when the relaxation oscillations are occurring, the spectral pattern emitted from the optical signal generator will have more longitudinal modes than when the output has stabilized. The phase of various optical modes may also be different during this time. Each of the longitudinal modes will create a different speckle pattern, which will "mix" or blend together to reduce the overall appearance of speckle in the light output. Some lasers are optically pumped instead of electrically and in this case there is a threshold optical power similar to the threshold current in electrically pumped lasers. In the examples that follow, it can be envisioned that the optical pumping can be modulated in a similar way as the electrical current to despeckle a laser output.

Lab observations by the inventors show that speckle is reduced by means of modulating the current provided to the optical signal generator. This can be achieved in a number of ways. In one embodiment, the drive current is pulsed from a light source "on" level to a level near, at, or below threshold current. The term 'near threshold' is defined as the current that results in two times the optical output power at threshold current. Threshold current is defined as a current input level at or above which the optical output is dominated by stimulated emission rather then spontaneous emission. In one embodiment, the threshold current is defined as a current above which light output is coherent and below which light output is not coherent In one embodiment a sine wave signal is modulated onto the drive signal to modulate the optical signal generator current such that while the "average" light intensity stays constant, the speckle is reduced by having the drive current regularly reach a level near, at or below threshold current. The frequency at which the drive signal reaches the current at, near, or below threshold may be dependent on the optical signal generator. In one embodiment the frequency at which the drive current drops to near, at or below threshold may be at or greater than 20 megahertz but less than 40 megahertz. In one embodiment the frequency is 40 megahertz to 50 megahertz. In one embodiment the frequency is at or greater than fifty megahertz. In one embodiment the frequency is at or greater than 100 megahertz. It is also contemplated that the modulation of the current may be dependent on the application such that the range of frequency could be very wide. By way of example and not limitation, in a scanning projector system the frequency used for system operation may be in the order of 100 MHz therefore despeckle modulation should be above that, for LCD type projector the modulation speed required by the application is ~300 Hz to few kHz so despeckle modulation can be kept much lower, for example 20 MHz. It is also contemplated in the future that power saving methods may pulse current, but would not perform such pulses at a rate sufficient to decrease speckle, unless such pulsing was also executed with the intent to reduce speckle. It is however contemplated that for scanning projection the power saving pulse may be applied at a high rate. In such a situation, a pre-bias would be necessary to minimize the turn-on delay of the scanning projection system. In this case, it is contemplated that when the drive signal is pulsed below the optical signal generator threshold current, it may be subsequently driven to a pre-bias level near threshold in order to reduce optical turn-on delay or prevent excessive optical overshoot of the optical signal generator.

Lab testing to date has not established a correlation between the duration of the period for drive current being near, at, or below threshold current in relation to increased speckle reduction. As a result, it is contemplated that the drive current may be near, at, or below threshold for any duration to time, subject to input power requirements for desired optical intensity and consistency. In one embodiment, the light source is on for a longer time prior than the light source is off or drive current is near, at or below threshold. As such, duty cycle is not important as is the frequency at which the drive current goes down to near, at, or below threshold. In one example embodiment, the light source on time is less than 25 nanoseconds and in another example embodiment the light source on time is less than 10 nanoseconds. Of course, in all instances, the timing, frequency and other operational factors depend on the light source and its inherent physical behavior. For example, in some instances, these factors may be related to the cavity length of the light source if the light source is a laser. In another embodiment these factors may depend on the amount of time it takes for a light source to achieve preferred mode or wavelength, or the settling time to coherence, or the time constants of electron energy state (carrier lifetime) for the lasing material. In one embodiment, these factors are dependant on the time for the light source to reach steady state wavelength and phase.

The speckle reduction may also be characterized in terms of the light source behavior itself. In one configuration, the light source is controlled to periodically transition between stimulated emission and spontaneous emission. In one embodiment this transition is defined as periodically having the output be at least 10% from spontaneous emission. By periodically controlling current input to the light source to a level which results in at least 10% of the light output being from spontaneous emission, speckle can be reduced. It is contemplated that forcing the light source to periodically transition to spontaneous light output may occur in any manner.

In one embodiment, the light source may be controlled to periodically output reduced coherence light instead of consistently outputting coherent light. The periodic generation and output of reduced coherence light has the effect of reducing speckle. It is contemplated that forcing the light source to periodically transition to reduced coherence light output may occur in any manner.

Similar speckle reduction is also achieved by means of relatively slow turn on of the optical signal generator. Thus, modulation current is increased to the threshold level (current at which the optical signal generator transitions to stimulated emission) and then increased to the desired final value. By repeating this pulse at high frequency, it has the effect of continually introducing relaxation oscillations and reducing speckle as described above, while minimizing optical turn-on delay of the optical signal generator.

Example environments of use include any environment or system which utilizes light and which improved light quality would improve system operation or quality of output. Example environments of use include a projector, free space application, backlighting or enclosed applications, laptops, cellular or mobile phones, bar code scanners, projection devices including projection beam devices, spectrometry, night vision, laser range finders, target identification and illumination, hologram illumination, CD/DVD/Blu-ray optical storage applications, medical applications, lithography including but not limited to printing applications and semiconductor manufacturing devices, LCD devices, LED devices, single light source devices, multiple light source devices, where single color or multiple color, multiple color light sources, multiple light sources of the same color, light scanning system, medical equipment using highly coherent light sources, industrial applications where highly coherent light sources are used for example in laser cutting, laser engraving, or laser ablation. The projection device may project onto any thing including a screen, backlighting, or an object. The projection systems may be stationary, portable, retina scan projectors, automotive projectors, HUD displays or any other projection system.

By way of example and not limitation, scanning projection applications typically utilize an optical signal generator drive current pulse that is varied on a pixel-by-pixel basis to the level required for the particular pixel, as shown in FIGS. 1A and 1B. FIG. 1A illustrates a plot of optical pulses having minimal oscillations. FIG. 1B illustrates a plot of current pulses which generate the optical pulses of FIG. 1A. As shown herein, the components in the figures are not necessarily to scale, emphasis instead being placed upon illustrating the principles of the invention. In the figures, identical reference numerals designate corresponding parts throughout the different views. In FIGS. 1A and 1B, the magnitude is shown on a vertical axis 104 while time is represented on the horizontal axis 108. The optical signal magnitude 116 is shown in relation to the corresponding current pulse 120. A pixel period 112, defined as the time frame during which one pixel of information is output to a view or from the system.

As shown in FIG. 1A, since the optical signal generator is always operating above threshold, relaxation oscillations 124 are minimal and occur for a very short amount of time. As a result, the light output is coherent and the speckle pattern is very apparent. The corresponding current pulse 130, shown in FIG. 1B, likewise, is at a consistent magnitude during the pixel period resulting in the optical signal of FIG. 1A.

To reduce or eliminate speckle, the characteristic of the current signal, such as current pulses can be modified. By modifying the optical signal generator current pulse to return to threshold, below threshold, or near-threshold, the optical signal generator will have increased relaxation oscillations, which will result in reduced speckle as described above and herein. FIGS. 2A and 2B illustrate current and optical signal plots for current driver signals which create increased relaxation oscillations in the optical signal. FIG. 2A illustrates the optical signal having increased oscillations. FIG. 2B illustrates drive current pulses which create the optical signal shown in FIG. 2A. The vertical axis 104 represents magnitude of the optical signal and the current pulses. The horizontal axis 108 represents time.

The principles and innovation described herein may also be applied to constant light intensity based projectors. An example of such a projector is a LCD projector. Although the optical signal generator current may not be pulsed on a pixel-by-pixel basis for constant light intensity based projectors, the same method can be applied where the optical signal generator is pulsed at high frequency with the same average current in order to reduce speckle. In one embodiment, this average current level can occur on a frame by frame basis and be modulated to achieve the same benefit of the reduced speckling.

It is also contemplated that the system may modulate the current signal. By modulating the near-threshold current (similar to using the oscillator signal), further advantages may be realized either in terms of varying the relaxation oscillation characteristics or tolerating variation in the optical signal generator threshold current over temperature. Numerous modulation methods are possible, such as using a sine wave oscillator, square wave pulses or any other type of modulation method.

FIGS. 3A, 3B, and 4 illustrate exemplary plots of pulses or signals which reduce speckle. FIG. 3A illustrates an exemplary optical signal plot resulting from the drive current pulses shown in FIG. 3B. FIG. 3B illustrates a plot of drive current pulses. In these example plots, the current pulses range between $I_{ON}$ and $I_{TH}$. $I_{ON}$ represents current level intended to turn on the light source to a desired intensity and $I_{TH}$ represents threshold current. By pulsing the current between threshold current $I_{TH}$ and an $I_{ON}$ current level, the resulting optical signal includes oscillations, which reduce or eliminate speckle.

It is also contemplated that the current may remain below or near threshold for a time period, which in turn causes the light intensity to fade, as represented in the plot shown in FIG. 3A. The time period during which the current remains at threshold may vary and be selected to optimize light quality and intensity.

FIG. 4 illustrates an exemplary plot of stepped driver current pulses. It is also contemplated that the current magnitude may be reduced to zero, then stepped to threshold level, and then to $I_{ON}$ as shown. Stepping the current up from zero to a threshold current level has the effect of a slow turn on. This can reduce turn-on delay to full on current (for a particular pixel) by stepping the current level to threshold first, and then to on current. This in turn allows system to meet specification for fast optical on time and display or projection response time. In addition, this method will reduce optical overshoot and ring, which could damage a light source mirror or the light source itself.

FIG. 5 illustrates an exemplary plot wherein driver current drops below threshold current but does not reach zero. In this exemplary plot, the current signal 504 rises the $I_{ON}$ current value to generate light output from the light source. After being at an on level for a period of time, the current drops to a value at or below threshold current, but above zero. Thereafter, the current again rises to $I_{ON}$. This process may repeat to maintain oscillation in the optical signal, which in turn reduces or eliminates speckle. Modulating the current to a level closer to threshold instead of to an off level (zero) has the advantage of minimizing optical turn-on delay while still achieving the objective of speckle reduction. It is contemplated that the light source could also be turned off and then back on and get speckle reduction, or at any level near threshold to off.

It is also contemplated that the current may not return all the way to threshold. Thus, as disclosed herein, the current level may be reduced to any level or stepped to any level during the return to $I_{ON}$. The step before returning to full $I_{ON}$ may be below, above, or at threshold current. Depending on the particular optical signal generator, different low current levels will yield different levels of beneficial results.

FIG. 6 illustrates an exemplary plot of a drive signal which reaches zero before returning to the near-threshold or "pre-bias" level. In this exemplary plot, the increasing current slope of the signal 604 is delayed or stepped at current level 608. Current level 608 may be at, below, or above threshold. By switching the optical signal generator current off before returning to the near-threshold or "pre-bias" level, then reductions in power consumption may also occur. In those cases, it may be desirable to switch to near-threshold before applying the $I_{ON}$ pulse in order to minimize turn-on delay of the optical signal generator or large optical spikes that could be harmful to the optical signal generator or mirrors. In one embodiment, the off or near-threshold or pre-bias level may occur only for a short amount of time, so the $I_{ON}$ pulse can exist for the majority of a pixel period. In other embodiments, the $I_{ON}$ pulse time may be for any time period. It is also contemplated that the peak $I_{ON}$ pulse may be adjusted to compensate for the off or near-threshold time in order to create the same average or integrated power level for the pixel period. $I_{ON}$ may be at the same or different magnitude over time.

FIG. 7 illustrates an example plot of a typical optical signal generator modulation per pixel. In this example plot, the modulation current magnitude is shown in the vertical axis 704 while the horizontal axis 708 represents time. The modulation signal would vary between different levels 716, 720, and 712, which may vary per pixel or be constant, depending on the application. A lower modulation current magnitude would reduce or eliminate the light output from the optical signal generator. The modulation signal did not regularly reach threshold current level 724 and as such, speckle occurred in prior art applications.

Figure 8:
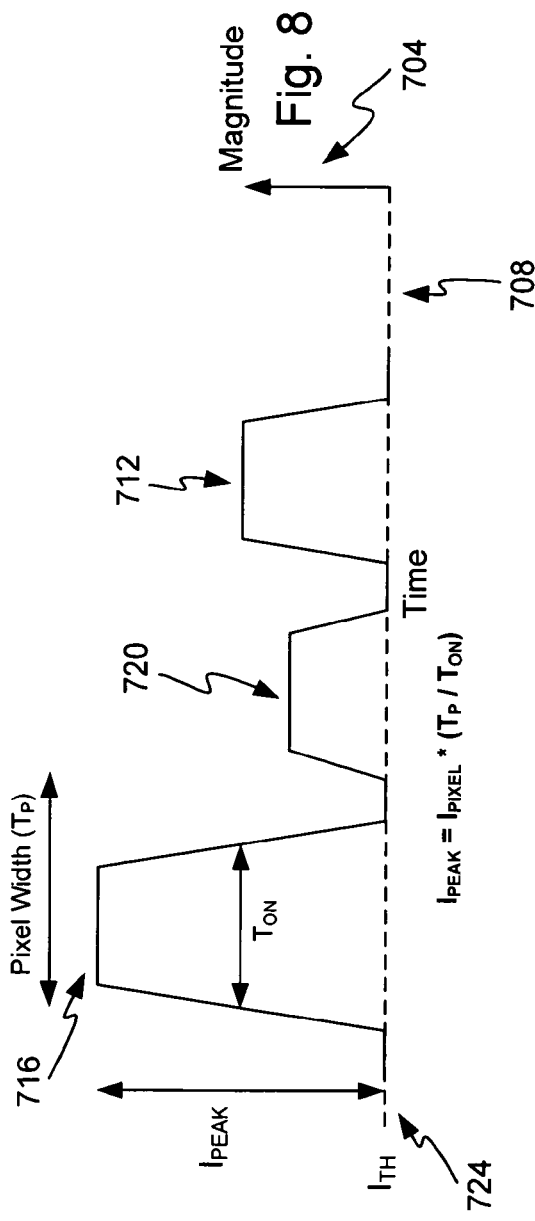
FIG. 8 illustrates an example plot of a speckle reduction modulation per pixel.

FIG. 8 illustrates an example plot of a speckle reduction modulation per pixel. As compared to FIG. 7, similar elements are labeled with identical reference numbers. In contrast to FIG. 7, the modulation signal returns to threshold current level 724, below, or close thereto. By returning to threshold, below, or close thereto speckle is reduced because oscillations are introduced into the resulting optical signal. These are exemplary plots and as such, the claims which follow are not limited to these signal plots. For example, the reduction of current to the optical signal generator to an amplitude near, at, or below threshold does not have to happen at the beginning of the pixel. In the exemplary plots of FIG. 8, or any other exemplary plot, it may also occur sometime in the middle of the pixel, at any time frame within the pixel period. The chance of visual artifacts appearing in the projected image can be minimized by scrambling the occurrence within the pixel period.

Figure 9:
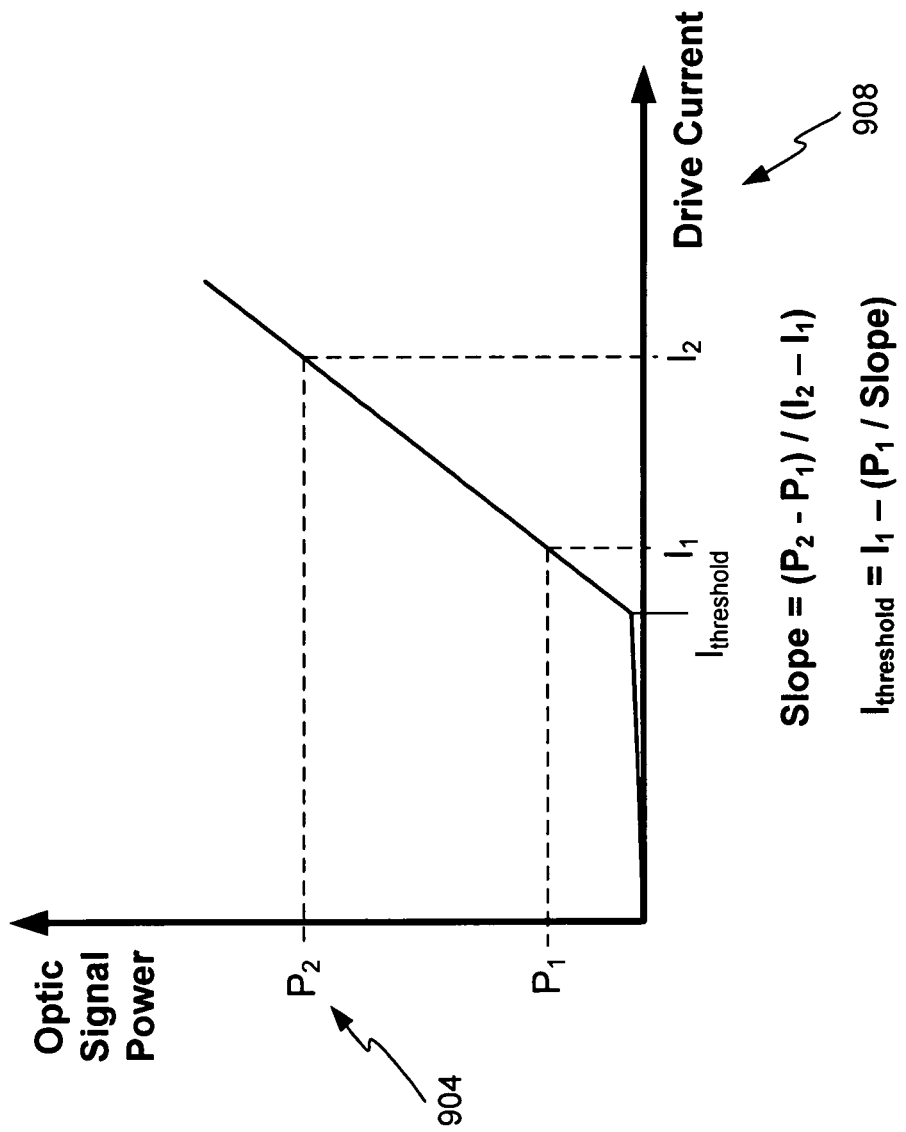
FIG. 9 illustrates an exemplary plot of optical signal power in relation to driver current.

There are many methods by which the near-threshold level can be set. Some examples include a power control loop, using an analog bias reference that is temperature compensated for threshold current variation, using a reference set by digital-to-analog converter with the values based on a look-up table stored in memory, or extrapolating to the threshold current based on measured power for 2 or more operating current levels. FIG. 9 illustrates an exemplary plot of optical signal power, on the vertical axis 904, in relation to driver current, on the horizontal axis 908. This plot illustrates that past threshold, increases in input current generates a generally proportional increase in optical signal power. As shown, for a current $I_1$, an optical signal power $P_1$ is output from the optical signal generator. For a current $I_2$, an optical signal power $P_2$ is output. Slope is defined as $(P_2-P_1)/(I_2-I_1)$. Threshold current is defined as $I_1-(P_1/\text{slope})$.

The method and apparatus disclosed herein has numerous advantages and benefits over the prior art. For example, other proposed methods for reducing speckle include the addition of a vibrator plate, phase array, use of a special screen or other mechanism to eliminate the speckle pattern. The additional components increase cost, size and potentially increase power dissipation of the projector solution, none of which are desirable in applications particularly, applications such as compact portable projectors where size, cost, power and battery life are a concern. There are no additional components and minimal power dissipation penalties with this innovation. This innovation may find use with any light source, laser, projection device, or application and may be used with newly developed or existing drivers.

Figure 10:
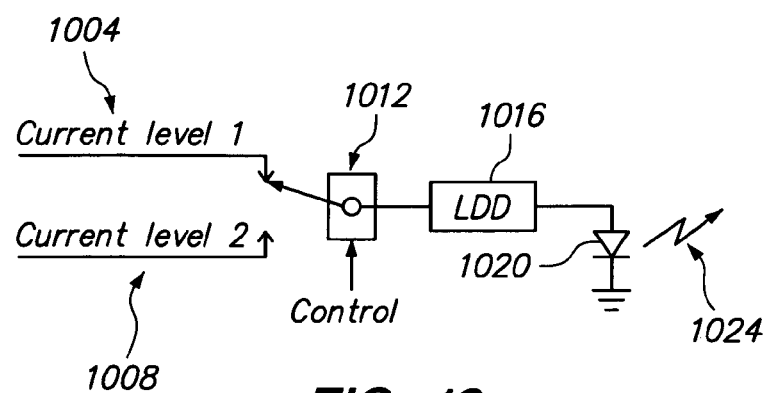
FIG. 10 illustrates an example embodiment of a current selector for an optical signal generator.

FIG. 10 illustrates an example embodiment of a current selector for an optical signal generator. This is but one possible embodiment and as such, it is contemplated that other embodiments may be arrived at without departing from the claims that follow. In this embodiment, a first current level node 1004 and a second current level node 108 are provided and selectable by a selector 1012, such as a switch. A control signal input determines the selector position. A processor or controller may generate the control signal. The current, at level one 1004 or level two 1008, is provided to an optical signal generator driver 1016. The current levels one and two 1004, 1008 can be established in any manner including, but not limited to using a digital to analog converter and/or a current generator as described before. The output from the driver 1016 is sent to the optical signal generator 1020, which in this embodiment comprises a laser diode. In other embodiments, any type light source may be utilized. A resulting light signal 1024 is output and utilized in accordance with the type of system when the apparatus of FIG. 10 is installed.

In operation, the system shown in FIG. 10 utilizes the control signal or other means to selectively connect or provide the current level one 1004 or current level two 1008, or neither, to the driver 1016. The control signal may be referred to as a duty cycle control signal. It is contemplated that the driver 1016 may be eliminated, and the current level one 1004 or current level two 1008, or any other level, could be selectively connected or switched to the optical signal generator 1012. In this example embodiment, the current level two 1008 may change if intensity of light changes are desired in the system. Current level one 1004 is selected to bias the laser near, at, or below threshold in order to achieve speckle reduction when the laser is modulated between current level one and current level two.

The driver 1016 generates an optical device driver current, which is routed to the optical signal generator 1020, which in turn generates the optical signal 1024. The resulting light signal 1024 is dependant on the environment of use. The control signal establishes, by selective connection to the current level one 1004, current level two 1008, or no current, creates the desired duty cycle modulated current which results in oscillation into the optical signal, which in turn reduced or eliminates unwanted speckle.

Figure 11:
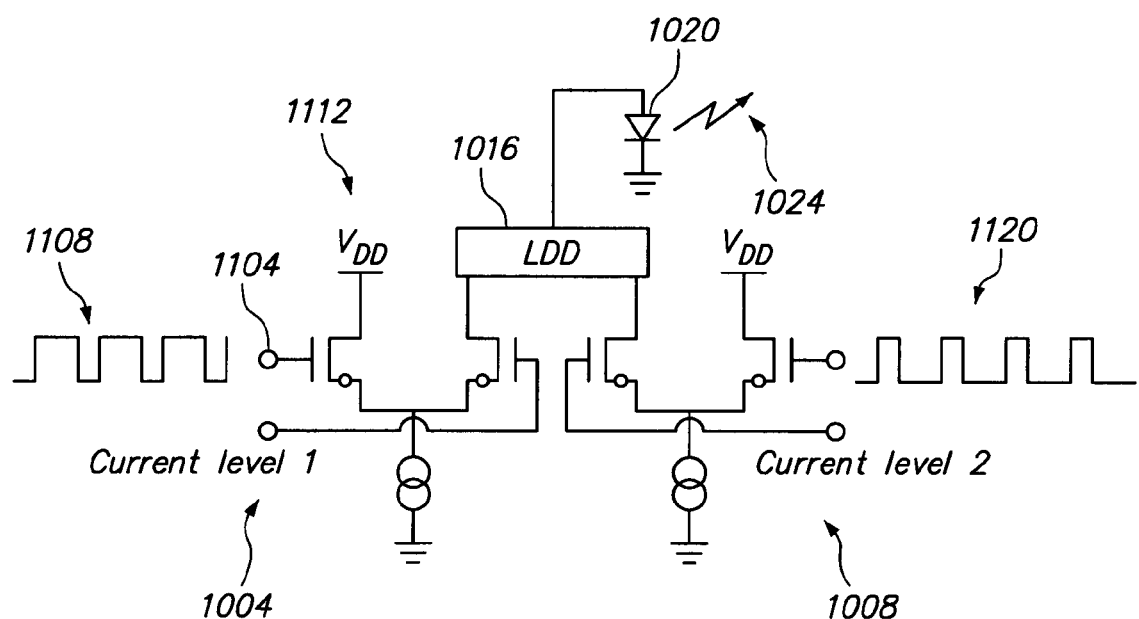
FIG. 11 illustrates an exemplary block diagram of an example implementation of a drive signal generator.

FIG. 11 illustrates an exemplary block diagram of an example implementation of a drive signal generator. This is but one possible embodiment and as such, it is contemplated that other embodiments may be arrived at without departing from the claims that follow. FIG. 11 also illustrates an exemplary control pulse input format which may be utilized to control the duty cycle of FIG. 11. These are provided for purposes of understanding and it is contemplated that other control signals may be utilized. As compared to FIG. 10, similar elements are labeled with identical reference numbers and are not discussed in detail again.

In this example embodiment a control signal input 1104 receives the control pulses 1108. The pulses selectively enable activation of the current mirror configuration 1112, thereby enabling conduction of VDD to the mirror and providing current at level one magnitude to an input of the driver 1016. The opposing side of the system shown in FIG. 11 which corresponds to current level 2 operates in a similar manner as described above for the operation of the mirror 1112. It is contemplated that the control signals 1108, 1120 are coordinated in time and synchronization to achieve desired operation. The control signals may be referred to herein as a duty cycle control signal in that the control signals control one or more aspects of the duty cycle of the drive signal and resulting optical signal.

In one or more embodiment, additional current mirror and associated control pulses may be provided to provide additional input to the driver 1016. In this manner, by either using only the two current levels shown, or additional current levels, numerous different drive current magnitudes may be provided to the driver 1106, which in turn may affect the output to the optical signal generator 1020 to have a desired oscillation level.

Figure 12:
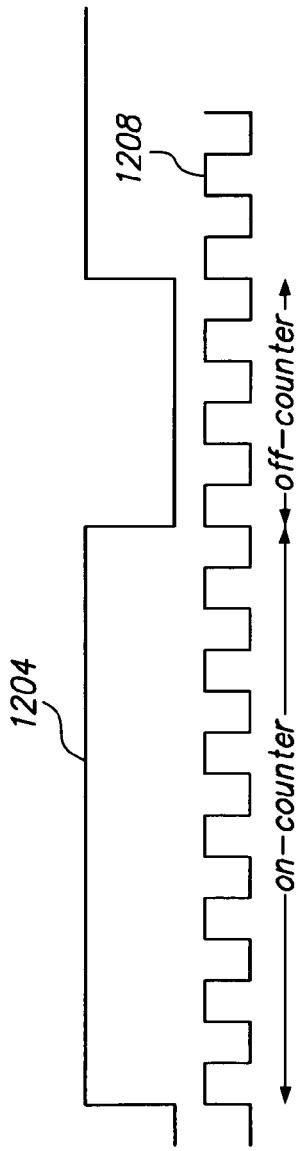
FIG. 12 illustrates a plot of one example method to create a duty cycle control signal.

FIG. 12 illustrates a plot of one example method to create a duty cycle control signal. In this exemplary plot, one or more high speed oscillators and one or more counters operate in unison to generate the duty cycle control signal, which may be utilized to control the duration of the on pulse and the off pulse (low signal level). By changing the values of the one or more counters, the system may change the duty cycle of the waveform 1118, 1120. In these plots, the duty cycle waveform is illustrated in the top plot 1204 and the counter output, both an on-counter signal and an off-counter signal, is shown in the lower plot 1208.

Figure 13:
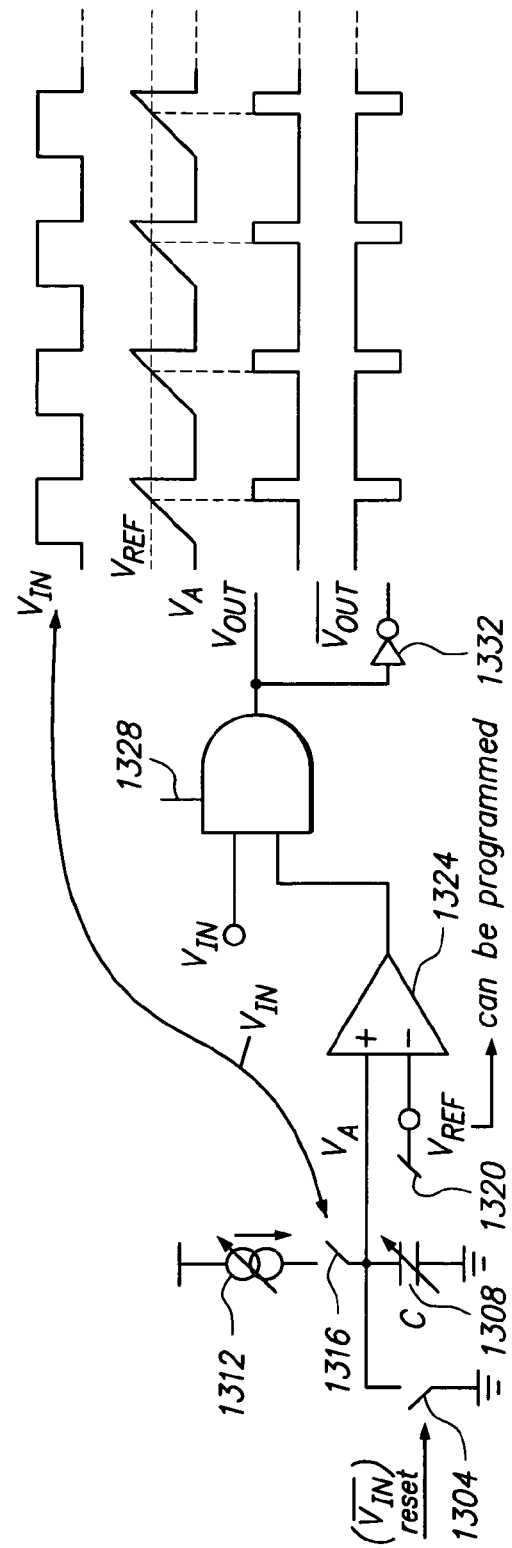
FIG. 13 illustrates an example embodiment of a duty cycle control signal generator with associated signal plots.

FIG. 13 illustrates an example embodiment of a duty cycle control signal generator with associated signal plots. In this example embodiment, a reset switch 1304 selectively connects a capacitor 1308 to ground, which can in turn discharge the capacitor. The capacitor 1308 is selectively connected to a current source 1312 via switch 1316. Through operation of the switch, the capacitor charges to a voltage $V_A$, and discharges. The voltage $V_A$ is fed into to a comparator 1324. The comparator 1324 also receives as an input a voltage $V_{REF}$, which is selected to achieve desired operation and duty cycle. When the comparator 1324 triggers its output is provided to an AND gate 1328, which in turn generates a duty cycle control waveform. The other input to the AND gate 1328 is $V_{IN}$. Changing the value $V_A$, or the current from source 1312, or capacitor value, the slope and other parameters of the saw tooth waveform can likewise be adjusted, which in turn changes the resulting duty cycle $V_{OUT}$. An inverter 1332 is provided to invert the output of the AND gate which in turn generates an inverse duty cycle signal. The plots shown in FIG. 13 include $V_{IN}$, $V_{REF}$, and $V_{OUT}$ and the inverse of $V_{OUT}$. These plots correspond to the signal nodes shown in the example embodiment.

Figure 14:
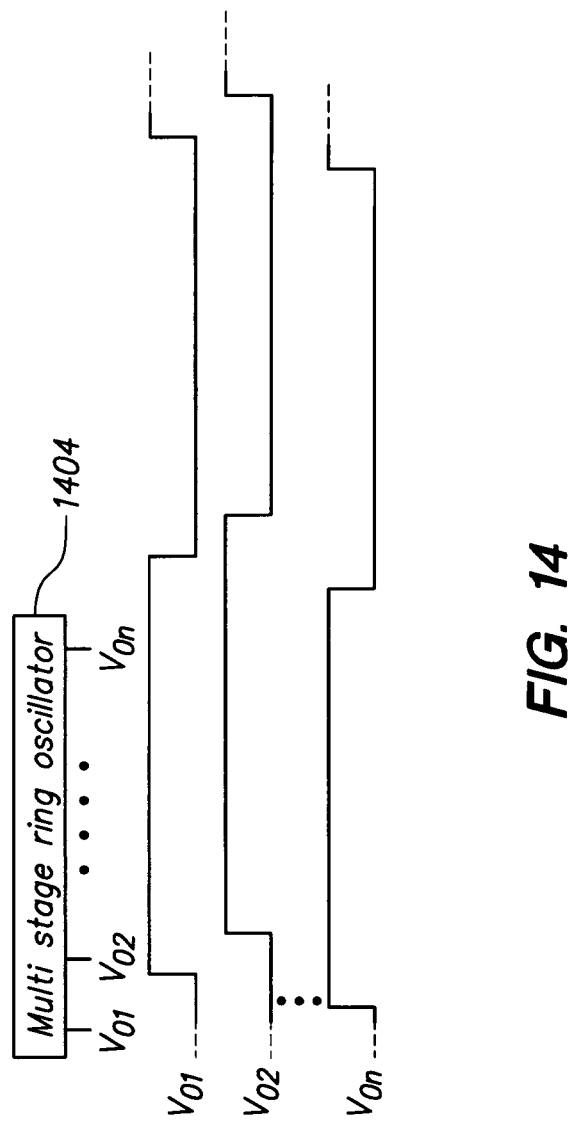
FIG. 14 illustrates an example embodiment of a multistage ring oscillator configured to generate a duty cycle control signal with associated signal plots.

FIG. 14 illustrates an example embodiment of a multistage ring oscillator configured to generate a duty cycle control signal with associated signal plots. In this embodiment, a multi-stage ring oscillator 1404 includes multiple outputs as shown. The output signals comprise outputs $V_{O1}, V_{O2}, \ldots V_{On}$. In this example embodiment, the ring oscillator 1404 comprises a chain of invertors and may also comprise one or more delays. The output waveforms $V_{O1}, V_{O2}, \ldots V_{On}$ are delayed by the propagation delay of the invertors. In this embodiment, the delay for $V_{On}$ is equal to the number n of the invertors, where n equal any whole number. The resulting signal plots $V_{O1}, V_{O2}, \ldots V_{On}$ correspond to the outputs associated with the oscillator 1404. It is also contemplated that using combinational logic, the outputs can be combined to give various and desired duty cycle control signals.

FIG. 15A illustrates a plot of sine wave drive current over time which ranges between $I_{PEAK}$ and threshold, $I_{TH}$. FIG. 15B illustrates a plot of an optical signal power over time resulting from the drive current shown in FIG. 15A. The optical signal power ranges between zero to two times the average power. This is one possible drive current signal and resulting optical signal. Other signal waveforms are contemplated.

FIG. 16A illustrates a plot of triangle wave drive current over time which ranges between $I_{PEAK}$ and threshold, $I_{TH}$. FIG. 16B illustrates a plot of optical signal power over time resulting from the drive current shown in FIG. 16A. The optical signal power ranges between zero to two times the average power. This is one possible drive current signal and resulting optical signal. Other signal waveforms are contemplated.

FIG. 17A illustrates a plot of pulse signal drive current over time which ranges between $I_{PEAK}$ and threshold, $I_{TH}$. FIG. 17B illustrates a plot of optical signal power over time resulting from the drive current shown in FIG. 17A. Because the drive signal is at $I_{PEAK}$ for a higher percentage of time than the drive signal is at $I_{TH}$, the peak optical power signal $P_{PEAK}$ does not need to be much greater than the average power level $P_{AVG}$. Therefore, the optical signal power ranges between zero to around 1.2 times the average power. This is one possible drive current signal and resulting optical signal. Other signal waveforms are contemplated.

In the cases of the sine wave and triangle wave, those signals can achieve the objective of reducing speckle if the minimum level of the signal is near or below threshold. However, due to the symmetry of those signals, the peak power is effectively 2 times the required average power level. Using a peak power level of 2× the average power could degrade the laser reliability if the laser is normally operated near the maximum specified power when not performing the speckle reduction modulation.

In the case of the pulse waveform, the asymmetric duty cycle (on time longer than off time) achieves the objective of reducing speckle while requiring a peak power level that is much lower than the sine wave or triangle wave examples. The peak power in the pulse waveform case could typically be around 1.2 times the average power level rather than 2 times the average power level in the sine wave and triangle wave cases. As the optical signal approaches the maximum average power rating for the laser, the pulse approach is therefore advantageous because the peak power is still compatible with acceptable peak power levels for reliable laser operation. It should be noted that the average power does not change significantly so damage to the device due to prolonged operation above specified limits is unlikely.

Other pulse shapes could also be used to effectively reduce speckle. This is mainly to highlight the one method, which is basically a method that limits the amount of time the laser is near or below threshold and quickly returns to the peak power level.

It is also noted that changing the timing of the near-to-below threshold pulse over time will reduce or eliminate any possible artifacts in a projected image. By moving the location, in time, of the at, near, or below threshold current level, the viewer or system will not perceive a pattern in light intensity changes, i.e. strobing. In embodiments with multiple light sources, the pulsing (or reduction) of the driver current can be unsynchronized or randomized to insure the resulting light output does not perceivably change in intensity.

Thus, it is contemplated that multiple light sources of the same or similar wavelength may be utilized and these multiple light sources are pulsed synchronously or asynchronously to the near, at, or below threshold level to reduce or prevent image artifact or reduce EMI. In a system having multiple light sources, the principles could be applied to one or more of such multiple light sources to reduce speckle.

Similarly, multiple light sources of different wavelengths are pulsed synchronously or asynchronously to the near, at, or below threshold level to reduce or prevent image artifacts or reduce EMI. It is also contemplated that the light source may be pulsed as described herein to the near, at, or below threshold at a different time period during the pixel period for each frame to reduce or prevent image artifacts or reduce EMI.

It is contemplated that in addition, drive current pulsing or reductions to threshold may occur at a rate above human perception. In addition, the effectiveness of this method may be reduced as the time between the near-to-below threshold pulses increases. The effectiveness is reduced because the oscillation in the optical signal only occurs for a limited time after returning to a higher power level.

In one embodiment, the speckle reduction methods described herein may be selectively enabled and disabled. This may be beneficial and desirable when performing analysis using projection or scanning with and without speckle pattern, such as in surface roughness analysis. In addition, the speckle reduction could be selectively turned off if the application benefits from speckle.

It is also contemplated that speckle reduction may result in additional benefits to systems adopting the speckle reduction methods disclosed herein. For example certain application may not necessarily appear to be disadvantaged by speckle, but speckle reduction will improve the quality of light, thereby allowing for other benefits, such as but not limited to improved signal to noise ratio, lower power output requirements, smaller geometry of an apparatus, higher data rates or resolution density, better accuracy or sensitivity.

Other systems, methods, features and advantages of the invention will be or will become apparent to one of ordinary skill in the art upon examination of the following figures and detailed description. It is intended that all such additional systems, methods, features and advantages be included within this description, be within the scope of the invention, and be protected by the accompanying claims. It is also contemplated that the speckle reduction methods and apparatus described herein may also be combined with other speckle reduction methods and apparatus to obtain combined speckle reduction.

It should be noted that based on lab testing, the speckle reduction affects the phase and frequency of the light, but other aspects, such as spatial coherence, often referred to as beam quality, is not affected. This is desirable since, in the case of lasers in particular, it is desirable to have spatial coherence.

Figure 18:
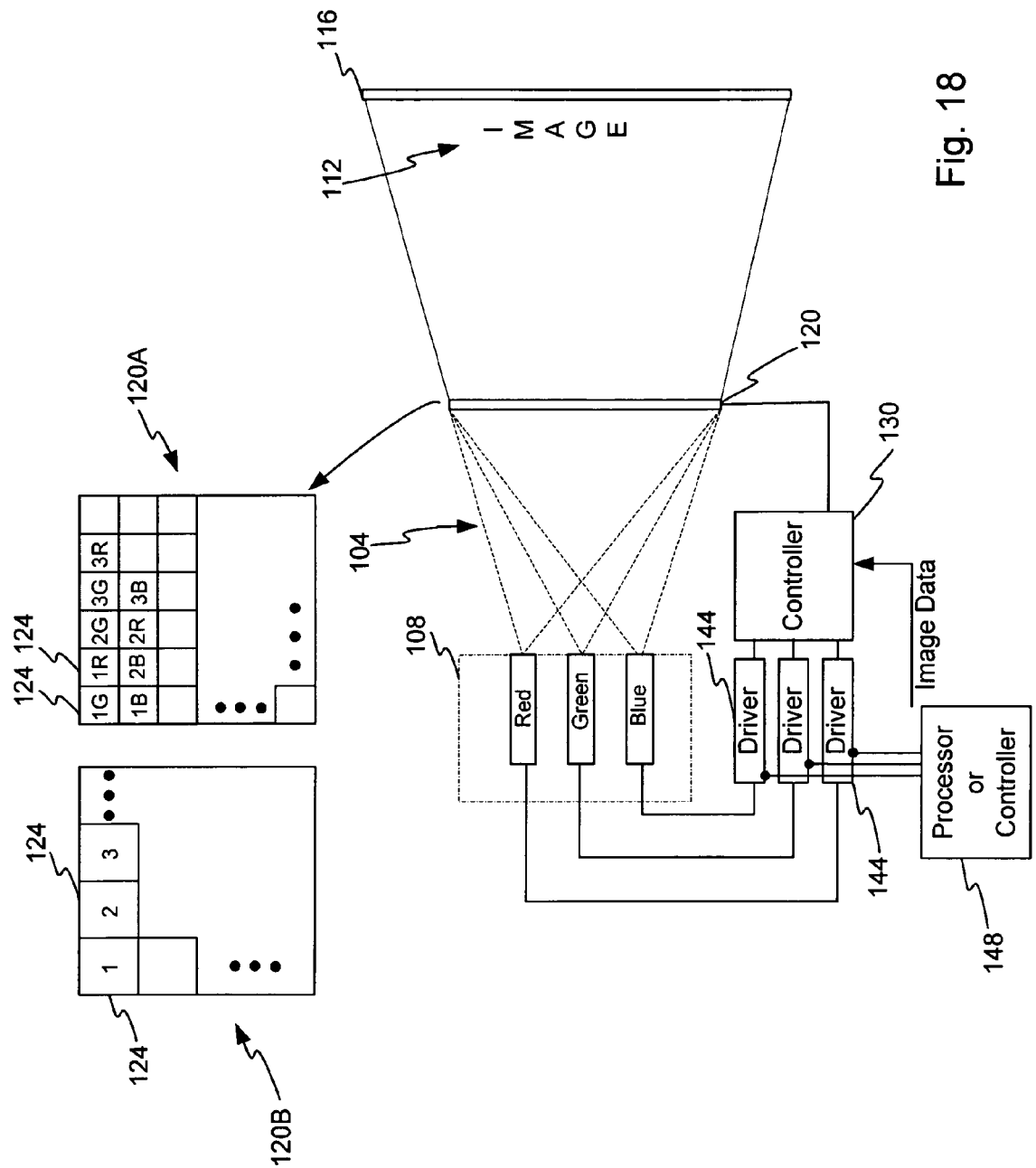
FIG. 18 illustrates an example environment of use.

FIG. 18 illustrates an example environment of use. Although shown in a projector system, it is contemplated that the method and apparatus disclosed herein is capable of use in many other environments as set forth herein. As discussed above, and as shown in FIG. 1A, in certain projector systems the light 104 is provided by 3 light sources 108, such as a red light source, green light source and blue light source. In other embodiments, different number of light sources may be utilized. In one embodiment, a single light source is utilized. The light sources may comprise a laser, LED, or any other light source as described above. The image 112 is created by shining on and filtering these optical signals through a pixel matrix 120. In one embodiment the pixel matrix 120 is an LCD/LCoS system however, in other embodiments the matrix may comprise any device or be omitted.

In this embodiment, the pixel matrix 120 is a matrix of pixels 124 where each one can be made transparent or opaque to light, or some level of opaqueness between transparent and opaque. The projected image 112 is created by shining through or blocking (selectively for each pixel) the light from the light sources 108. The resulting image 112 may be projected onto a viewing screen 116. Multiple pixel matrices (LCD/LCOs screens) may also be used in some embodiments (for example one per color).

The light sources 108 are driven by drivers 144 as shown. A controller 130 connects to the drivers 144 and the pixel matrix 120 to provide one or more control signals to these devices. In this example embodiment, the controller 130 receives image data although in other embodiments it is contemplated that other type data may be sent to the controller. The one or more control signals are sent to the pixel matrix 120 to control the opaqueness of each pixel during different time periods and/or frames. The term opaqueness is defined to the mean the amount of light which is allowed to pass through a pixel 124 in the pixel matrix 120.

In this example embodiment, the controller 130 is configured to cause the driver to periodically pulse to a near, at, or below threshold value, which in turn causes the light sources 108 to be near, at, or below threshold in physical operation. As described above, this reduces speckle. It is also contemplated that a controller or processor 148 may provided, instead of or in addition to the controller 130 inputs, such as a duty cycle control signal to the driver 144 which will cause the period reduction in output to at, near, or below threshold.

It is contemplated that the pixel may be clear, allowing 100% of the light to pass through, or opaque, allowing none (or very little) of the light to pass through, or any level of opaqueness there between to allow varying levels of light to pass through each pixel 124 of the pixel matrix 120.

The one or more control signals and the driver 144 control the light sources 108 to control the intensity, duration, periodic pulsing for speckle reduction, or other factor regarding the light emitted from the one or more light sources. It should be noted that in this example embodiment, the light sources are not on all on at the same time and as such each of the 3 light sources is on for one third of the duration of a frame. The slow reaction time of the human eye is such that each frame is perceived in full color even though the colors (light sources) are turned on in sequence. Similar principles as described herein may be applied to a scanning system using mirrors or lenses, or other scanning apparatus. The following pending application discusses laser projection systems which scan the image and it is hereby incorporated by reference in its entirety herein. Application Publication Number 20080055557 entitled Method and Apparatus for Controllably Modulating a Laser in a Laser Projection Display. This publication discusses a scanning type projection system.

At the top of FIG. 18 are two example pixel matrices 120A and 120B, either of which could be utilized. These pixel matrices are in the light path between the light sources 108 and the screen 116. In the pixel matrix 120 shown at the top of FIG. 1A, the part 120 has been rotated 90 degrees to aid in understanding of the pixel screen. In this example embodiment intended for purposes of discussion, the pixels 124 in the pixel matrix which correspond to the first pixel on the viewable image 112 are labeled '1'. The pixels for the second pixel on the viewable image 112 are labeled '2'. As can be appreciated, in this embodiment, the pixel matrix 120A has three pixels 124 for each pixel in the viewable image. In this embodiment, each pixel 124 is assigned to a light source color, such as red, green and blue and is thus controlled during the time period when that light source is emitting light. At other times, it may be opaque, to hinder or prevent light from passing through.

In one embodiment, as shown in pixel matrix 120B, there is a one to one correspondence between the pixels on the pixel matrix 120 and the pixels of the image 112. Each pixel 124 is separately controlled for each period of the frame. For example, if the frame time is divided into 3 time windows, one window for each of Red, Green, Blue, then the opaqueness of each pixel 124 would likely be different during each of the three time windows depending on the intensity and color for that pixel for the frame. As such, the opaqueness of each pixel 124 is controlled during the frame to allow the desired amount of light of each color to pass. The eye will tend to blend this light to create the actual desired color. It is contemplated that other methods of selectively allowing light to pass through the pixel matrix 120 may be developed which does not depart from the claims.

Although this example environment is discussed in connection with a pixel matrix, the benefits of speckle reduction as disclosed herein may be enabled with or without a pixel matrix or in any environment or system utilizing a light source which suffers from speckle.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A method for reducing speckle in light output from an optical signal generator comprising:
   generating a drive signal by modulating drive signal to a first magnitude, a second magnitude, and a third magnitude, the first magnitude is greater than a threshold current for the optical signal generator, the second magnitude is near, at or less than the threshold current for the optical signal generator, and the third magnitude is between the second magnitude and zero, wherein the modulating the drive signal to the first magnitude, the second magnitude, and the third magnitude occurs continuously during operation of the optical signal generator, and during a single pixel period, the signal is modulated to each of the first magnitude, the second magnitude, and the third magnitude;
   presenting the drive signal to an optical signal generator; and
   driving an optical signal generator using the drive signal to generate an optical signal, wherein periodically changing the drive signal from the first magnitude to the second magnitude and the third magnitude reduces speckle in the optical signal and when the drive signal is at the third magnitude, establishing the drive signal at the second magnitude before establishing the drive signal at the first magnitude to thereby reduce turn on delay.

2. The method of claim 1, wherein the optical signal generator comprises a laser.

3. The method of claim 1, wherein modulating the drive signal to the second magnitude generates a corresponding optical signal which is below optical threshold.

4. The method of claim 3, further comprising generating a duty cycle control signal, wherein the duty cycle control signal controls the duration drive signal at the second magnitude.

5. The method of claim 1, wherein creating the drive signal comprises switching the drive signal between a first current level, a second current level, and a third current level.

6. The method of claim 5, wherein modulating occurs at a rate greater than or equal to 20 MHz.

7. A method for reducing speckle in light output from an optical signal generator comprising:
   generating a drive signal by modulating drive signal to a first magnitude and a second magnitude such that the first magnitude is different than the second magnitude, the first magnitude is greater than a threshold current for the optical signal generator and the second magnitude is near, at or less than the threshold current for the optical signal generator, wherein the modulating the drive signal to the first magnitude and the second magnitude occurs continuously during a single pixel period of the optical signal generator such that during a single pixel period the signal is modulated two or more times to the first magnitude and the second magnitude;
   presenting the drive signal to an optical signal generator; and
   driving an optical signal generator using the drive signal to generate an optical signal, wherein changing the drive signal multiple times during a single pixel period from the first magnitude to the second magnitude reduces speckle in the optical signal and establishing the drive signal at the second magnitude before establishing the drive signal at the first magnitude reduces speckle in the optical signal.

8. The method of claim 7, wherein the optical signal generator comprises a laser.

9. The method of claim 7, wherein switching the drive signal between the first signal and the second signal results in the optical signal generator not initiating or sustaining stimulated emission output when presented with the second signal.

10. The method of claim 7, further comprising:
    generating a control signal; and
    presenting the control signal to a switch, wherein the switch performs the switching between the first signal and the second signal based on the control signal.

11. The method of claim 7, wherein near threshold is defined as the current that results in two times the optical output power at threshold current.

12. The method of claim 7, wherein modulating occurs at a rate greater than or equal to 20 MHz.

* * * * *